United States Patent
Berberich

(10) Patent No.: US 6,674,344 B2
(45) Date of Patent: Jan. 6, 2004

(54) ELECTRONIC DEVICE

(75) Inventor: Reinhold Berberich, Frankfurt (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/101,127

(22) Filed: Mar. 19, 2002

(65) Prior Publication Data

US 2002/0137391 A1 Sep. 26, 2002

(30) Foreign Application Priority Data

Mar. 21, 2001 (DE) .......................... 101 13 912

(51) Int. Cl.[7] ................................................ H03H 7/00
(52) U.S. Cl. ....................................... 333/185; 333/182
(58) Field of Search ........................... 333/12, 182–185; 361/818, 715; 439/620

(56) References Cited

U.S. PATENT DOCUMENTS

| | | | | |
|---|---|---|---|---|
| 4,935,710 A | * | 6/1990 | Yamazaki et al. | 333/167 |
| 4,945,323 A | * | 7/1990 | Gerstenberg et al. | 333/185 |
| 5,101,322 A | * | 3/1992 | Ghaem et al. | 361/715 |
| 5,459,443 A | * | 10/1995 | Mouissie | 333/184 |
| 5,504,659 A | * | 4/1996 | Acatay et al. | 361/816 |
| 6,037,846 A | * | 3/2000 | Oberhammer | 333/182 |
| 6,198,362 B1 | | 3/2001 | Harada et al. | 333/12 |
| 6,297,981 B1 | * | 10/2001 | Berberich et al. | 363/144 |
| 2002/0068485 A1 | * | 6/2002 | Busch et al. | 439/620 |

FOREIGN PATENT DOCUMENTS

| | | | |
|---|---|---|---|
| DE | 39 37 183 A1 | 1/1991 | H05K/1/02 |
| DE | 199 11 731 A1 | 10/1999 | H05K/3/46 |
| DE | 299 02 505 U1 | 3/2000 | H01R/13/719 |

* cited by examiner

Primary Examiner—Saungsook Ham
(74) Attorney, Agent, or Firm—Cohen, Pontani, Lieberman & Pavane

(57) ABSTRACT

An electronic device includes a housing for accommodating a carrier substrate. An electronic module and a conductor structure for making electrical connection with the electronic module are fitted on the carrier substrate. A filter device for improving the electromagnetic sensitivity is arranged in the housing. The filter device is formed by an electrical and/or capacitive connection of a first conductor surface of the conductor structure to an external first potential and by an electrical and/or capacitive connection of a second conductor surface of the conductor structure to a second electrical potential, the first conductor surface and the second conductor surface being arranged approximately opposite one another.

11 Claims, 2 Drawing Sheets

ELECTRONIC DEVICE

BACKGROUND OF THE INVENTION

1. Field of the Invention

The invention relates to an electronic device having a housing for accommodating a carrier substrate and a filter device arranged in the housing for improving the electromagnetic sensitivity of the device, said carrier substrate being fitted with an electronic module and a conductor structure for making electrical connection with the electronic module.

2. Description of the Related Art

Shielding electronic devices against interference radiation which occurs in the high frequency range is required to ensure satisfactory functioning of electronic devices. Such interference suppression measures are usually provided in the interior of the electronic device.

German reference DE 299 02 505 U1 discloses a planar filter in which a capacitor is formed on a ceramic substrate. One side of the ceramic substrate is provided with the mass electrode and the other side with the signal electrodes of the capacitor. The signal electrodes form insular regions, which surround pin bushings of signal pins. Such interference suppression filters are used in electronic control devices in a motor vehicle, the interference suppression filter being arranged directly at the inlet of the plug connections in the housing.

It is disadvantageous here that during the mounting of this planar filter, satisfactory functioning of the planar filter is ensured only if a reliable electrical and/or capacitive connection to the housing is ensured to avoid undefined capacitance values.

SUMMARY OF THE INVENTION

It is an object of the present invention to provide an electronic device which has a filter device that is also suitable for mass production and which is easy to adjust.

The object of the present invention is achieved by a filter device formed by an electrical and/or capacitive connection of a first conductor surface of the conductor structure to an external first potential and by an electrical and/or capacitive connection of a second conductor surface of the conductor structure to a second electrical potential, the first and second conductor surfaces being arranged approximately opposite one another.

The present invention has the advantage that the filter device is an integral component of the carrier substrate and can be prepared at the time the printed circuit board is manufactured. When the first and second conductor surfaces are installed in the device, the conductor surfaces only need to be connected to the electrical potentials. The position of the filter formed by the first and second conductor surfaces is permanently predefined by the installation position of the printed circuit board. The mounting procedure does not require any additional adjustment measures such as occur when separate filter devices are used. This has the advantage that a customary printed circuit board which has a plurality of conductor tracks lying one on top of the other acts itself as a filter device.

In one embodiment of the present invention, the first electrical potential is a voltage which is supplied externally to the electronic module, and the second potential is that of the housing which is embodied so as to be electrically conductive.

In a further embodiment of the present invention, the part of the carrier substrate which comprises the filter device covers a housing opening through which a lead for supplying the first electrical potential to the interior of the housing engages.

The filter device can thus easily be positioned at the location where experience has shown that the greatest incidence of interference radiation is to be expected, and prevents, when mounted in accordance with the specifications, the ingress of high frequency radiation into the interior of the housing. This results in a device which can be handled particularly satisfactorily for mass production.

The first conductor surface of the filter device advantageously forms a first capacitor surface which surrounds the external lead, and a second conductor surface forms a second capacitor surface which is arranged above and/or below the first conductor surface, electrically insulated therefrom. If multilayer printed circuit boards are used, by simply electrically connecting the layers of different configuration it is possible to provide a filter device on which the electronic components are simultaneously arranged and provided with electrical contacts.

The external lead is advantageously formed by at least one plug-in element of a plug-in device which is arranged in or on the opening of the housing so as to cover it, the plug-in element being electrically connected to the first capacitor surface so as to engage into the carrier element through the opening.

In this way, a single pressing-in operation is effective for securing the plug a simultaneously making electrical contact with the capacitor electrode.

The use of a plug-in device with a plurality of plug-in elements makes it easily possible for the first capacitor surfaces, which are electrically insulated from one another and are associated with different plug-in elements, to be formed for each plug-in element in one conductor layer.

Such a structure can easily be manufactured during one operation when the printed circuit board is manufactured.

The filter device may be implemented in a particularly simple embodiment when the second conductor surface is embodied on the surface of the carrier substrate as an unstructured contact layer which bears partially against the electrically conductive housing. In this embodiment, the step of bringing about electrical connection to the second conductor surface is dispensed with. As a result of this measure, the housing itself acts as a second capacitor plate.

To form a further capacitor for the same plug-in element, the carrier substrate advantageously has two further conductor surfaces which lie one on top of the other and are electrically insulated from one another. The third conductor surface is electrically conducted to the plug-in element and the fourth conductor surface is electrically connected to the housing potential. As a result of this multilayer structure, which is limited solely by the conductor layers present in the carrier substrate, relatively large capacitance values for each plug pin may be implemented.

In one embodiment, the fourth conductor surface may also be implemented as an unstructured contact surface which is arranged on the second outer side of the carrier element, the unstructured contact surfaces which lie approximately one on top of the other are electrically connected to one another in the periphery of each plug-in element by a plurality of vias. As a result, a type of Faraday cage is formed around the plug-in element. That, along with the fact that an outer side of the carrier element bears tightly against the preferably electrically conductive housing, reliably prevents interference radiation from penetrating the interior of the housing.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
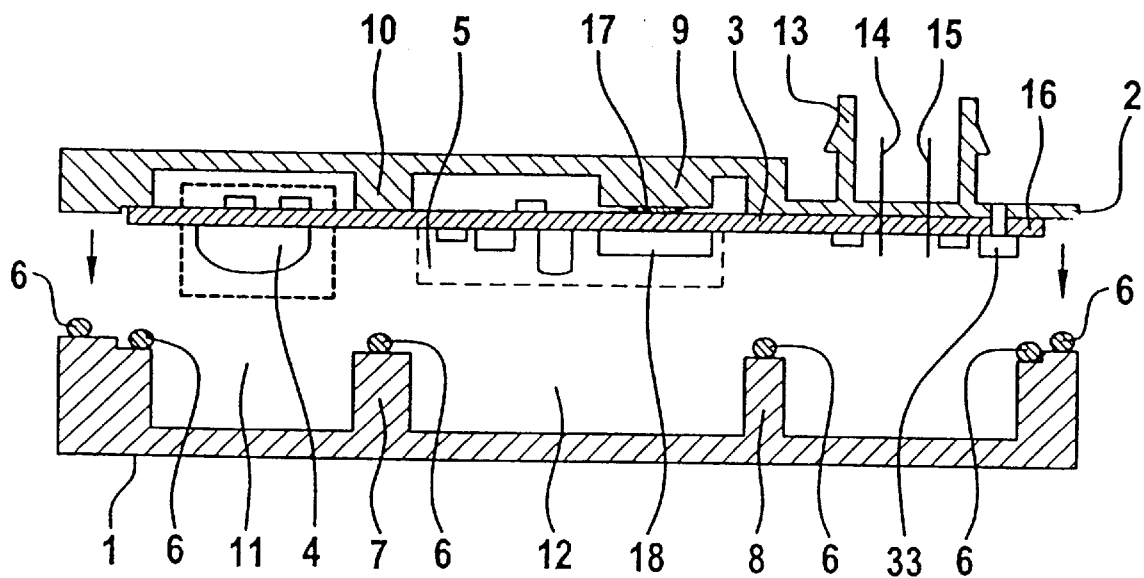
FIG. 1 is a sectional view through a control device according to an embodiment of the present invention.

FIG. 1 illustrates an electrical device that is generally used in motor vehicles. This device may comprise a control device for a motor vehicle which has signal-processing electronics which are known to be very susceptible to high-frequency interference. However, the electronic device may also comprise a sensor device which has not only the actual sensor but also a signal-conditioning circuit and/or a signal-evaluation circuit which are arranged on one printed circuit board or a plurality of printed circuit boards.

The electronic device has an electrically conductive cup-shaped housing part 1 which is composed, for example, of aluminum and which is sealed off with a cover 2 which is also electrically conductive. A multilayer printed circuit board 3 is fitted with a sensor 4 and signal-conditioning electronics 5 for the sensor 4 and is arranged within the housing part 1. The housing part 1 and cover 2 are sealed with respect to one another by a conductive rubber seal 6. The housing part 1 has two webs 7, 8 which project into the interior of the housing and the cover has two webs 9, 10 which project into the interior. The webs 7, 8 confrontingly oppose the webs 9, 10 and define two shielding chambers 11, 12, the sensor 4 is secured in the shielding chamber 11 and the signal-conditioning electronics 5 are secured in the shielding chamber 12.

The web 9 of the cover 2 serves simultaneously as a cooling dome which is in thermal contact with the printed circuit board 3 via a thermally conductive bonding agent 17. On the side of the printed circuit board 3 opposite the cooling dome, a power component 18 of the signal-conditioning electronics 5 is arranged. The power dissipation which is emitted by this power component 18 is conducted away to the surroundings via the cooling dome.

A plug 13 is arranged on the cover 2 and includes plug pins 14, 15 which are inserted through the cover 2. The plug pins 14, 15 contact an end region 16 of the printed circuit board 3. The plug pins 14,15 connect the sensor 4 or the signal-conditioning electronics 5 to electronic devices in the motor vehicle via the conductive levels of the multilayer printed circuit board 3. The plug pins 14, 15 are used to supply signals and electrical power for the modules 4 and 5 located in the interior of the housing 1, 2.

Figure 2:
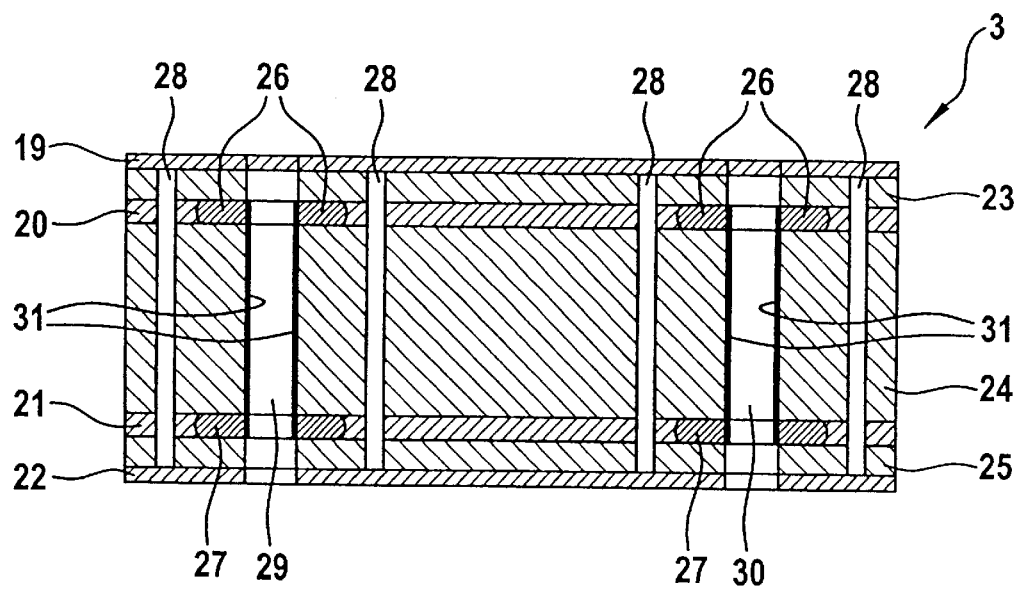
FIG. 2 is a section through a filter device according to the present invention.

The end region 16 of the printed circuit board 3 which is embodied as a filter device is illustrated in FIG. 2. The printed circuit board 3 comprises a multilayer construction and is composed of conductor surface layers 19, 20, 21 and 22 which are pressed together and have preferably glass fiber-reinforced plastic resin layers 23, 24, 25 positioned therebetween. The glass fiber-reinforced plastic resin is the customary FR 4 base material used in electronics. The illustration in FIG. 2 shows only the conductor layers which are necessary to implement the filter device. The printed circuit board may have more conductive layers.

According to the embodiment shown in FIG. 2, the printed circuit board 3 is provided with four conductor surface layers 19, 20, 21, 22 which are embodied as copper layers. One copper layer 19, 22 is arranged on each of the two outer sides of the printed circuit board 3. These layers 19, 22 are unstructured here. Within the printed circuit board 3 there are two further copper layers 20, 21 which are insulated from one another and in which insular capacitor surfaces 26, 27 are formed.

The two outer unstructured copper layers 19, 22 are connected to the housing potential, preferably ground. This is effected by the copper layer 19 bearing against the electrically conductive cover 2. The unstructured conductor surface 19 is preferably wetted with electrically conductive bonding agent, as a result of which the position of the printed circuit board can be reliably fixed in this region.

Alternatively, the unstructured copper layer 19 may also bear against the conductive cover 2 in an insulated fashion and thus be capacitively connected, and the electrical connection of the unstructured copper layer 22 may be made via the screw connection 33. The unstructured copper layers 19, 22 may also be connected to the conductive cover 2 using a combination of the above-described connections.

The copper layers 19, 22 are connected by a plurality of vias 28 which are arranged such that they surround the capacitor surfaces 26, 27, providing shielding.

The capacitor surfaces 26, 27 each respectively surround an opening 29, 30 of the printed circuit board 3 into which the plug pins 14 and 15 engage. These openings 29, 30 are metallized in the region 31 between the capacitor surfaces 26, 27, each capacitor surface 26, 27 being connected at the boundary surface to the metallized opening 29, 30, as a result of which an electrical connection is produced. After the plug pin 14, 15 is inserted into the respective opening 29, 30, the capacitor surfaces 26, 27 are at plug potential. In this way, two capacitors are formed for each plug pin.

In this embodiment, press-in operations for forming contacts, in which contact is made by the plug pins by pressing them into the circuit board 3, are particularly advantageous as electrical connecting mechanisms. In this embodiment, both the attachment of the plug and the formation of electrical contact with the capacitor plates are effected by a single pressing-in operation.

If more capacitors are required, they can easily be obtained by the further alternating installation of copper layers which form the structured capacitor surfaces and unstructured copper layers which are formed over the entire surface and are at housing potential. If necessary, a multiplicity of such conductor surfaces which are insulated from one another can be arranged within the printed circuit board 3.

Figure 3:
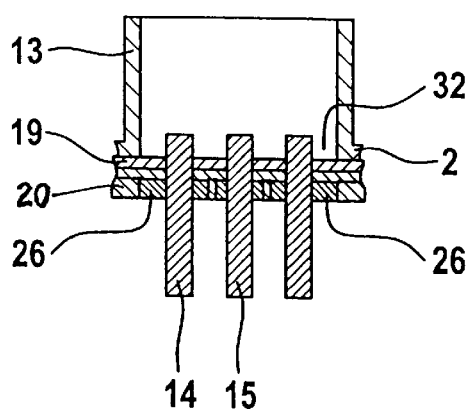
FIG. 3 is a sectional view of a side of the filter device with a plug inserted therein.
Figure 4:
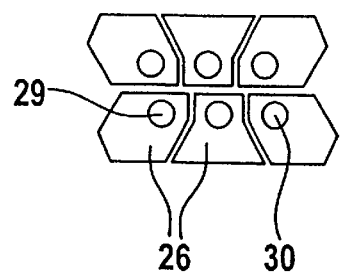
FIG. 4 is a plan view of a structured capacitor surface.

The position of the filter device with respect to the plug shown in FIG. 3 in which just one capacitor 19, 20 is illustrated. The structured conductor layer 20 has a plurality of capacitor surfaces 26 which are insulated from one another, as illustrated in FIG. 4. Here, for each plug pin 14, 15 a capacitor surface 26 is provided, which surrounds the opening 29, 30 of the respective plug pin 14, 15. The printed circuit board 3 closes off the housing opening completely here, the unstructured contact layer 19 bearing against the regions of the cover 2 which surround the housing opening 32.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

I claim:

1. An electronic device, comprising:
   a housing;
   a carrier substrate inserted in said housing and having an electrical conductor structure with a first conductor surface and a second conductor surface arranged so that at least a portion of said first conductor surface opposes at least a portion of said second conductor surface;
   an electronic module fitted on said carrier substrate and in electrical connection with said electrical conductor structure; and
   a filter device for improving the electromagnetic sensitivity of said electronic module, said filter device comprising said first and second conductor surfaces, wherein said filter device is formed within said carrier substrate and further comprises a first connection of said first conductor surface to an external first potential and a second connection of said second conductor surface to a second potential, and wherein each of said first and second connections comprises at least one of an electrical and a capacitive connection.

2. The electronic device of claim 1, wherein said housing is electrically conductive, said first electrical potential is an externally supplied voltage, and said second potential is the potential of said housing.

3. The electronic device of claim 2, wherein said housing comprises a housing opening and a lead in said housing opening for supplying said first potential to said carrier substrate in said housing, said filter device being arranged on a portion of said carrier substrate that covers said housing opening.

4. The electronic device of claim 1, wherein said housing comprises a housing opening and an external lead in said housing opening for supplying said first potential to said carrier substrate in said housing, said filter device being arranged on a portion of said carrier substrate that covers said housing opening.

5. The electronic device of claim 3, further comprising a first capacitor surface surrounding the lead and formed from said first conductor surface of said filter device, and a second capacitor surface one of above and below the first conductor surface and electrically insulated therefrom is formed from the second conductor surface.

6. The electronic device of claim 4, further comprising a first capacitor surface surrounding the external lead and formed from said first conductor surface of said filter device, and a second capacitor surface one of above and below the first conductor surface and electrically insulated therefrom is formed from the second conductor surface.

7. The electronic device of claim 6, further comprising a plug-in device covering said housing opening and having at least one plug-in element, wherein said external lead is formed by said at least one plug-in element of said plug-in device, said at least one plug-in element extending through the housing opening and being electrically connected to said first capacitor surface of said carrier element.

8. The electronic device of claim 7, wherein said plug-in device comprises a plurality of plug-in elements and said first conductor surface comprises a plurality of first capacitor surfaces which are electrically insulated from one another and are associated with different ones of said plurality of plug-in elements.

9. The electronic device of claim 5, wherein said second conductor surface is formed as an unstructured contact layer on a surface of said carrier substrate which bears at least partially against said electrically conductive housing.

10. The electronic device of claim 7, wherein said carrier substrate comprises third and fourth conductor surfaces electrically insulated from one another and lying one on top of the other to form a further capacitor for the at least one plug-in element, the third conductor surface being electrically connected to the at least one plug-in element and the fourth conductor surface being electrically connected to the housing potential.

11. The electronic device of claim 10, wherein said second and fourth conductor surfaces comprise unstructured contact layers and said electronic device further comprises a plurality of vias for electrically connecting said second and fourth conductor surfaces within the periphery of each plug-in element.

* * * * *